(12) United States Patent
Li et al.

(10) Patent No.: US 10,290,622 B2
(45) Date of Patent: May 14, 2019

(54) METHOD FOR EXPANDING SPACINGS IN LIGHT-EMITTING ELEMENT ARRAY

(71) Applicant: PlayNitride Inc., Tainan (TW)

(72) Inventors: Yu-Chu Li, Tainan (TW); Yu-Hung Lai, Tainan (TW); Tzu-Yang Lin, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/959,286

(22) Filed: Apr. 23, 2018

(65) Prior Publication Data

US 2018/0240941 A1    Aug. 23, 2018

Related U.S. Application Data

(62) Division of application No. 14/886,429, filed on Oct. 19, 2015, now abandoned.

(30) Foreign Application Priority Data

Oct. 20, 2014   (TW) .............................. 103136145 A

(51) Int. Cl.
*H01L 33/48*   (2010.01)
*H01L 25/075*  (2006.01)
*H01L 25/00*   (2006.01)
*H01L 23/00*   (2006.01)
*H01L 21/683*  (2006.01)
*H01L 33/00*   (2010.01)

(52) U.S. Cl.
CPC .............. *H01L 25/50* (2013.01); *H01L 24/83* (2013.01); *H01L 24/95* (2013.01); *H01L 25/0753* (2013.01); *H01L 21/6836* (2013.01); *H01L 33/0095* (2013.01); *H01L 2221/68336* (2013.01); *H01L 2224/83001* (2013.01); *H01L 2224/83192* (2013.01); *H01L 2224/95001* (2013.01); *H01L 2224/97* (2013.01); *H01L 2924/0002* (2013.01)

(58) Field of Classification Search
CPC combination set(s) only.
See application file for complete search history.

(56) References Cited

U.S. PATENT DOCUMENTS 5,110,388 A * 5/1992 Komiyama ................ C09J 4/06
                                                156/229
5,411,921 A * 5/1995 Negoro ................ H01L 21/6835
                                              257/E21.505
5,882,956 A * 3/1999 Umehara .............. H01L 21/304
                                              257/E21.237
6,312,800 B1 * 11/2001 Noguchi ............. H01L 21/6835
                                              428/354

(Continued)

*Primary Examiner* — Michael Lebentritt
*Assistant Examiner* — Jordan M Klein
(74) *Attorney, Agent, or Firm* — JCIPRNET

(57) ABSTRACT

A method for expanding spacings in a light-emitting element array includes the following steps of: providing a light-emitting element array unit including a stretchable supporting film, and a plurality of light-emitting elements disposed on the stretchable supporting film and arranged into a two-dimensional array; stretching the stretchable supporting film along a first direction and a second direction. The first direction and the second direction respectively correspond to a row direction and a column direction of the two-dimensional array.

13 Claims, 3 Drawing Sheets

(56) References Cited

U.S. PATENT DOCUMENTS

| | | | | |
|---|---|---|---|---|
| 6,534,386 B2* | 3/2003 | Irie | H01L 21/561 | 257/E21.599 |
| 8,153,475 B1* | 4/2012 | Shum | H01L 21/6835 | 257/E21.025 |
| 9,391,286 B1* | 7/2016 | Kwon | H01L 51/0097 | |
| 2003/0124291 A1* | 7/2003 | Ausen | A61K 9/7023 | 428/40.1 |
| 2005/0009299 A1* | 1/2005 | Wada | H01L 21/304 | 438/459 |
| 2005/0215033 A1* | 9/2005 | Yamamoto | H01L 21/67132 | 438/464 |
| 2005/0230840 A1* | 10/2005 | Soejima | H01L 21/6835 | 257/773 |
| 2006/0197094 A1* | 9/2006 | Sugawara | H01L 33/20 | 257/79 |
| 2008/0102541 A1* | 5/2008 | Kang | H01L 33/0095 | 438/15 |
| 2009/0267230 A1* | 10/2009 | Hwan | H01L 21/561 | 257/737 |
| 2010/0029023 A1* | 2/2010 | Neff | H01L 33/0095 | 438/15 |
| 2010/0148704 A1* | 6/2010 | Howng | H05B 33/0803 | 315/313 |
| 2010/0279437 A1* | 11/2010 | Neff | H01L 33/0095 | 438/14 |
| 2011/0180939 A1* | 7/2011 | Sasaki | C08L 33/10 | 257/783 |
| 2012/0052608 A1* | 3/2012 | Yoo | H01L 33/505 | 438/27 |
| 2014/0001656 A1* | 1/2014 | Ebe | H01L 21/568 | 257/787 |
| 2014/0077235 A1* | 3/2014 | Kwon | H01L 33/0095 | 257/88 |
| 2014/0091348 A1* | 4/2014 | Katayama | H01L 21/56 | 257/98 |
| 2014/0340877 A1* | 11/2014 | Nelson | F21V 33/0008 | 362/103 |
| 2015/0263256 A1* | 9/2015 | Hsieh | H01L 33/62 | 257/91 |
| 2016/0043254 A1* | 2/2016 | Krause | H01L 31/1876 | 136/244 |
| 2016/0049602 A1* | 2/2016 | Kim | H01L 51/0097 | 257/40 |

* cited by examiner

METHOD FOR EXPANDING SPACINGS IN LIGHT-EMITTING ELEMENT ARRAY

CROSS-REFERENCE TO RELATED APPLICATION

This application is a divisional application of and claims the priority benefit of U.S. patent application Ser. No. 14/886,429, filed on Oct. 19, 2015, now pending, which claims the priority benefit of Taiwan Patent Application No. 103136145, filed on Oct. 20, 2014. The entirety of each of the above-mentioned patent applications is hereby incorporated by reference herein and made a part of this specification.

FIELD

The disclosure relates to a method for expanding spacings in a light-emitting element array and a light-emitting element array unit, more particularly to a method for expanding spacings in a light-emitting element array using a stretchable supporting film, and a light-emitting element array unit used in the method thereof.

BACKGROUND

The transfer of light-emitting elements, such as LEDs, from an epitaxial substrate onto a package substrate, requires high alignment accuracy. Often, the spacing between light-emitting elements on the epitaxial substrate does not match the spacing between predetermined positions of the package substrate on which light-emitting elements are to be mounted. A conventional approach to this problem has been to individually transfer each of the light-emitting elements onto the package substrate such that adjustments in spacing on the package substrate are possible. However, such conventional method is meticulous, time consuming, and requires relatively high accuracy in aligning the light-emitting elements onto the package substrate. Moreover, advancements in technology have contributed to a general reduction in the size of light-emitting elements (such as micro LEDs), demanding an even higher level of accuracy, and raising the standards in the transfer and alignment of light-emitting elements onto package substrates.

SUMMARY

Therefore, an object of the disclosure is to provide a method that can alleviate at least one of the aforesaid drawbacks of the prior art.

According to one aspect of the present disclosure, a method for expanding spacings in a light-emitting element array includes the following steps of:

providing a light-emitting element array unit including a stretchable supporting film, and a plurality of light-emitting elements disposed on the stretchable supporting film and arranged into a two-dimensional array; and stretching the stretchable supporting film along a first direction and a second direction which respectively correspond to a row direction and a column direction of the two-dimensional array.

According to another aspect of the present disclosure, a light-emitting element array unit used in the method thereof is provided. The light-emitting element array unit may include a stretchable supporting film, and a plurality of light-emitting elements disposed on the stretchable supporting film and arranged into a two-dimensional array. The stretchable supporting film is formed with a plurality of through holes in position corresponding to the light-emitting elements.

In light of the foregoing, by stretching the stretchable supporting film along the first direction and/or the second direction ensures uniform spacing of the light-emitting element array along the corresponding direction(s). Relatively high alignment accuracy can be achieved according to the present disclosure while transferring the light-emitting element array to a package substrate.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
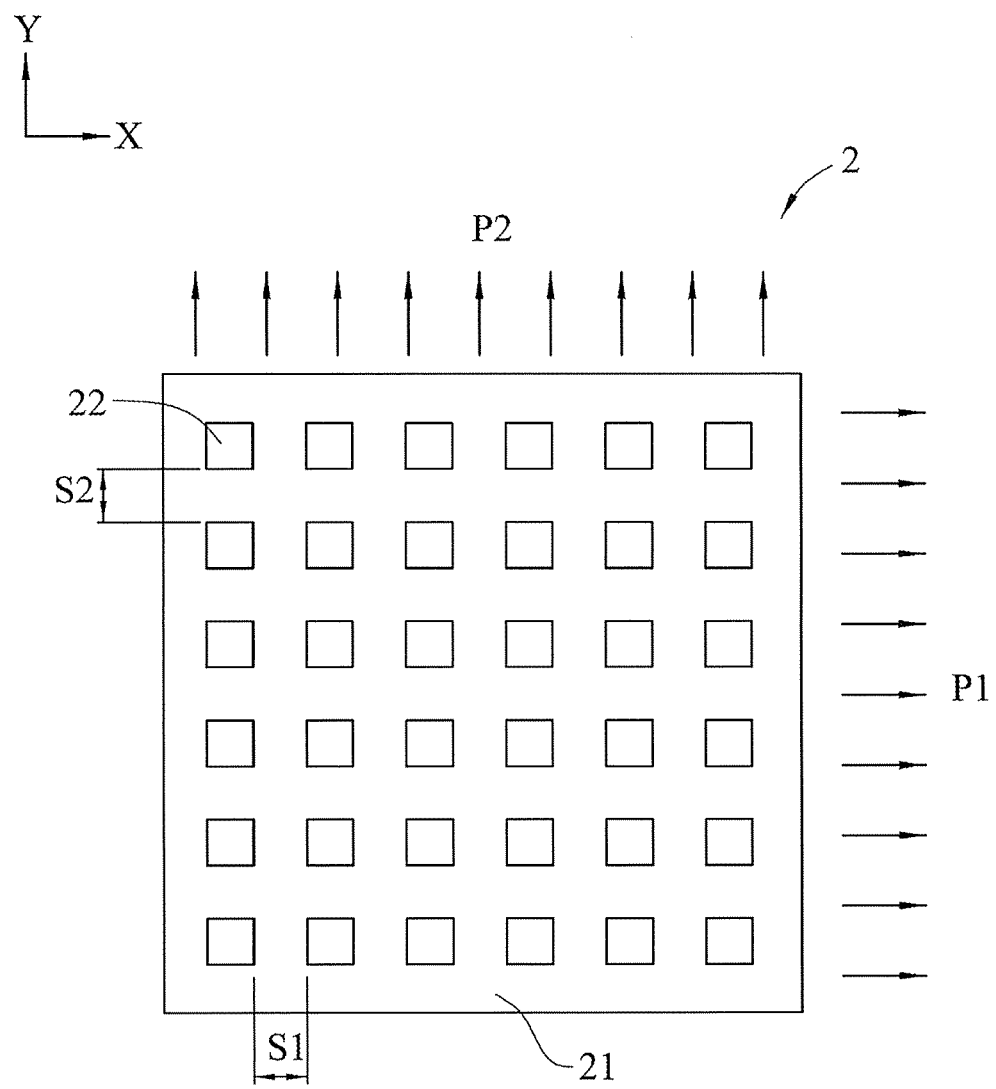
FIG. 1 is a schematic view showing a light-emitting element array unit used in the exemplary embodiment of a method for expanding spacings in a light-emitting element array according to the present disclosure.
Figure 2:
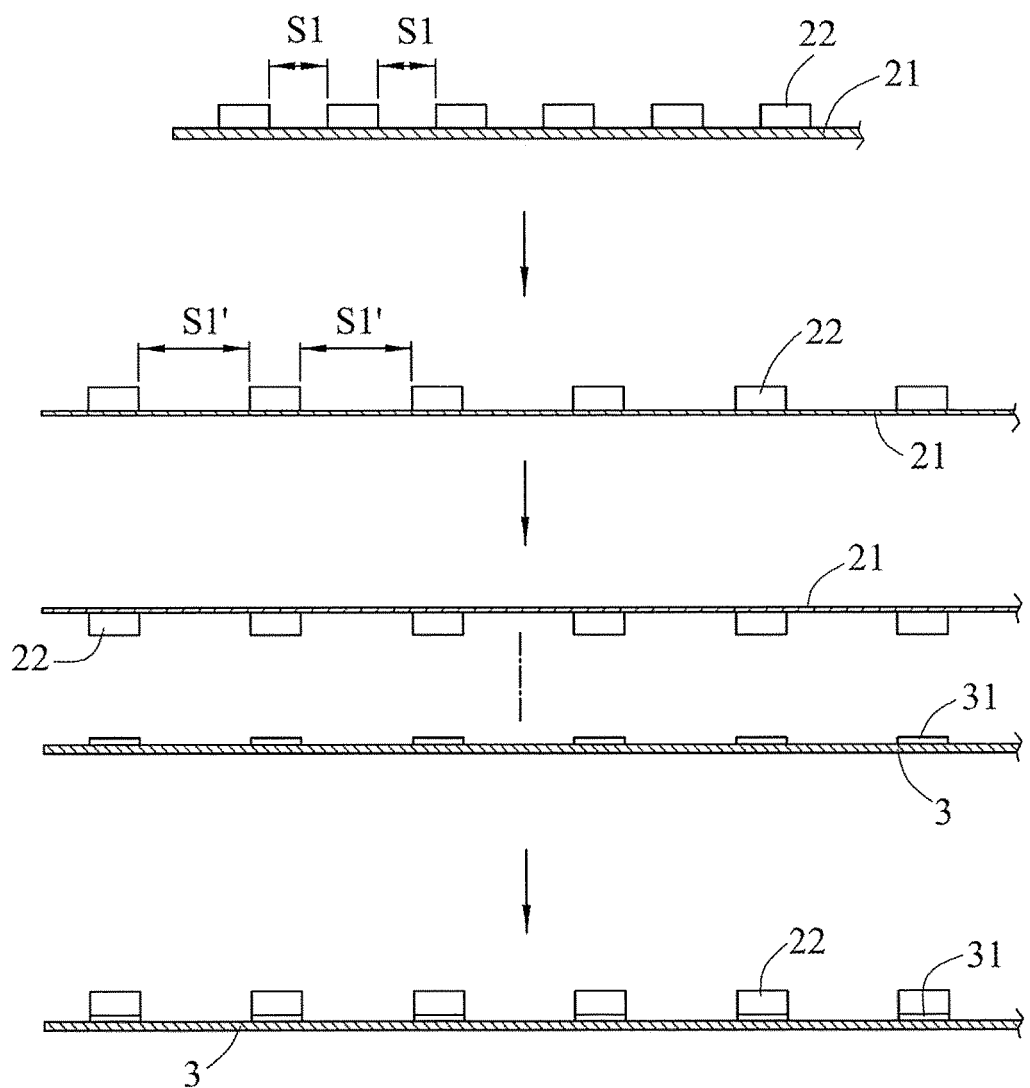
FIG. 2 is a schematic sectional diagram illustrating consecutive steps of the exemplary embodiment.

Referring to FIGS. 1 and 2, the exemplary embodiment of a method for expanding spacings in a light-emitting element array is shown to include Steps (a) to (c) as follows.

Step (a): providing a light-emitting element array unit 2, which includes a stretchable supporting film 21, and a plurality of light-emitting elements 22 that are disposed on the stretchable supporting film 21 and that are arranged into a two-dimensional array.

The stretchable supporting film 21 can be made of a flexible polymeric material and exhibits adhesive property so as to allow the light-emitting elements 22 to be adhered thereon. In certain embodiments, the stretchable supporting film may be a blue tape which allows the light-emitting elements 22 to be easily removed therefrom, a light release tape which has reduced adhesion strength after being irradiated with light having a predetermined wavelength such as UV light, or a thermal release tape which has reduced adhesion strength after being heated to a predetermined temperature. In this embodiment, the stretchable supporting film 21 is preferably a blue tape to save the time and cost of the process.

Each of the light-emitting elements 22 has semiconductor layers and is operable to emit light within a predetermined wavelength range (i.e., to emit green, blue or red light). The dimensions of the light-emitting elements 22, such as height or width, may be identical or different. It should be noted that the light-emitting elements 22 may have a width ranging from 1 μm to 100 μm. In certain embodiments, the light-emitting elements 22 may have dimensions ranging from 3 μm to 30 μm, and a distance between two adjacent light-emitting elements 22 may range from 2 μm to 25 μm.

In this embodiment, each of the light-emitting elements 22 is configured into a geometric shape, such as a quadrilateral shape shown in FIG. 1. As shown in FIG. 1, the light-emitting elements 22 in each row of the two-dimensional array are arranged along a row direction, and the light-emitting elements 22 in each column of the two-dimensional array are arranged along a column direction. Adjacent two of the light-emitting elements 22 in each row of the two-dimensional array are spaced apart from each other by a first spacing (S1), and adjacent two of the light-emitting elements 22 in each column of the two-dimensional array are spaced apart from each other by a second spacing (S2). It should be noted that the first and second spacings (S1), (S2) may be identical or different. In this embodiment, the first and second spacings (S1), (S2) are identical.

Step (b): stretching the stretchable supporting film 21 along a first direction (X) and a second direction (Y) so as to expand the first and second spacings (S1), (S2).

Step (b) can be conducted by a stretching apparatus, such as a film expander, to stretch the stretchable supporting film 21 along either one or both of the first direction (X) and the second direction (Y) by a predetermined tensile stress, so as to expand the first spacing (S1) and/or second spacing (S2) to a predetermined value, which may correspond to a predetermined spacing suitable for a package substrate. In this preferred embodiment, the first direction (X) and the second direction (Y) respectively correspond to the row direction and the column direction of the two-dimensional array of light-emitting elements 22. In other words, the stretchable supporting film 21 is stretched along either one or both of the row direction and the column direction of the two-dimensional array of the light-emitting elements 22. It should be noted that, in this embodiment, Step (b) may be conducted by having one side of the stretchable supporting film 21 secured and stretching the stretchable supporting film 21 from the other side thereof. In other embodiments, Step (b) may be conducted by stretching the stretchable supporting film 21 simultaneously from two opposite sides thereof.

In this embodiment, Step (b) is conducted by first stretching the stretchable supporting film 21 along the first direction (X) by a first tensile stress (P1) so as to expand the first spacing (S1) to an expanded first spacing (S1'), followed by stretching the stretchable supporting film 21 along the second direction (Y) by a second tensile stress (P2) to expand the second distance (S2) to an expanded second spacing (S2'), which may be identical to or different from the expanded first spacing (S1'). It should be noted that in certain embodiments, Step (b) may be conducted by first stretching the stretchable supporting film 21 along the second direction (Y) and then stretching the same along the first direction (X). In certain embodiments, Step (b) may be conducted by stretching the stretchable supporting film 21 simultaneously along the first and second directions (X), (Y) of the two dimensional array of the light-emitting elements 22.

When the first and second spacings (S1), (S2) are expanded to be the expanded first and second spacing (S1'), (S2') by stretching (FIG. 2 only shows the stretching of the stretchable supporting film 21 along the first direction (X), so that the expanded second spacing (S2') is not shown), a step (c) is further provided in this embodiment.

Step (c): attaching a surface of each of the light-emitting elements 22, which are away from the stretchable supporting film 21, onto a package substrate 3, followed by removing the stretchable supporting film 21 therefrom.

In this embodiment, the package substrate 3 has a plurality of connecting pads 31 that correspond in position to the light-emitting elements 22 on the stretchable supporting film 21 after Step (b). In other words, the connecting pads 31 are arranged in a manner similar to that of the light-emitting elements 21 and have spacings respectively corresponding to the expanded first and second spacings (S1'), (S2') of the light-emitting elements 22. The package substrate 3 may be, but is not limited to, a printed circuit board, a TFT substrate, a CMOS substrate, a substrate having transistors or integrated circuits incorporated therein, a substrate having metal redistribution lines or the like. Each of the connecting pads 31 may be configured as a single-layered or multi-layered structure and is made of electrically conductive materials, such as metal materials, non-metal conductive materials (e.g., conductive polymers, graphite, graphenes and black phosphorus), or combinations thereof. In certain embodiments, the connecting pads 31 are made of an alloy material having a eutectic point lower than 300° C., so that attachment of the light-emitting elements 22 onto the connecting pads 31 may be conducted by heating the connecting pads 31 to a temperature above the eutectic point, followed by cooling so as to fixedly attach the light-emitting elements 22 onto the connecting pads 31 of the package substrate 3.

It should be noted that, in certain embodiments where the stretchable supporting film 21 is a light release tape (such as UV tape), the removal of the stretchable supporting film 21 in Step (c) may be conducted by irradiating the stretchable supporting film 21 with a light having a predetermined wavelength (e.g., UV light), so as to reduce adhesion strength between the stretchable supporting film 21 and the light-emitting elements 22. In addition, in certain embodiments where the stretchable supporting film 21 is a thermal release tape, the removal of the stretchable supporting film 21 from the light-emitting elements 22 in Step (c) may be conducted by heating the stretchable supporting film so as to reduce adhesion strength between the stretchable supporting film 21 and the light-emitting elements 22. In certain embodiments where the stretchable supporting film 21 is a blue tape, the removal of the stretchable supporting film 21 in Step (c) may be conducted by directly peeling off the stretchable supporting film 21 from the light-emitting elements 22.

By disposing the light-emitting elements 22 on the stretchable supporting film 21 and by stretching the same, the first and second spacings (S1), (S2) among the light-emitting elements 22 in the two-dimensional array can be accurately expanded. In addition, the stretching of the stretchable supporting film 21 along the first direction (X) and/or the second direction (Y) further ensures uniform spacings of the light-emitting elements 22 along the corresponding direction(s). As such, relatively high alignment accuracy can be achieved according to the present disclosure while transferring the light-emitting elements 22, especially when transferring the light-emitting elements 22 having small dimensions onto the package substrate 3.

Figure 3:
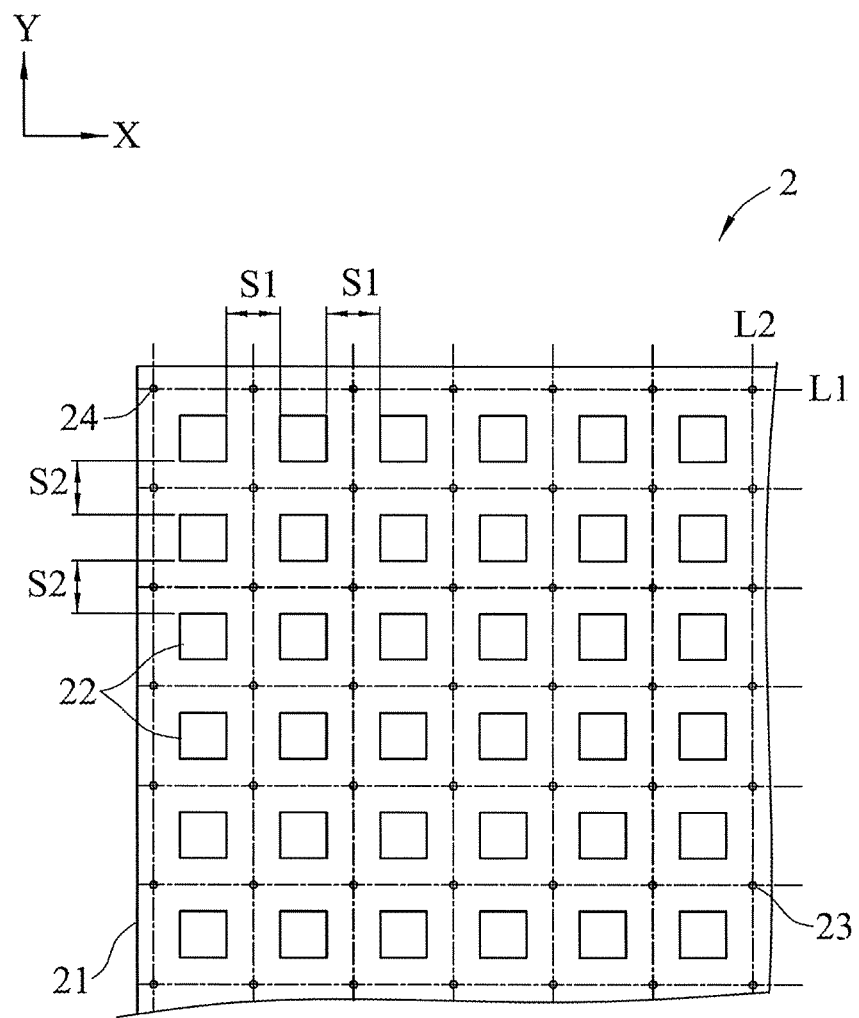
FIG. 3 is a schematic top view showing a variation of the light-emitting element array unit.

FIG. 3 shows a variation of the light-emitting element array unit 2. In the variation of the light-emitting element array unit 2, the stretchable supporting film 21 is formed with a plurality of through holes 23, each corresponding in position to the light-emitting elements 22. As shown in FIG. 3, each of the light-emitting elements 22 of this embodiment is configured into a geometric shape with at least three corners. In this embodiment, the geometric share is a quadrilateral shape provided with four corners, and the through holes 23 correspond in position to the corners of the light-emitting elements 22 or midpoints on sides of the light-emitting elements 22 (not shown). Specifically, the stretchable supporting film 21 of this embodiment has a plurality of first imaginary lines (L1) each located equidistantly between two adjacent rows of the light-emitting elements 22, i.e., passing through the midpoints of the second spacings (S2), and a plurality of second imaginary lines (L2) each located equidistantly between two adjacent columns of the light-emitting elements 22, i.e., passing through the midpoints of the first spacings (S1). The through holes 23 of this embodiment are periodically formed on the first and second imaginary lines (L1), (L2) and correspond in position to the light-emitting elements 22. More specifically, each of the through holes 23 may correspond in position to at least two light-emitting elements 22. For example, like in this embodiment, the through holes 23 can be formed at intersections 24 of the first and second imaginary lines (L1), (L2). In other words, each of the through holes 23 may correspond in position to four adjacent light-emitting elements 22 in this embodiment. In other embodiments, the through holes 23 may be periodically formed at positions on the first and second imaginary lines (L1), (L2) that correspond to the midpoints of the sides of the light-emitting elements 22, where the through holes 23 correspond in position to two adjacent light-emitting elements 22.

The formation of the through holes 23 facilitates uniform stress distribution throughout the stretchable supporting film 21 while the same is being stretched, so as to further ensure uniform spacing of the light-emitting elements 22 along the corresponding direction(s). As such, the light-emitting elements 22 can be transferred onto the package substrate 3 in a more precise manner as shown in FIG. 2 after Step (b). It should be noted that a too much higher number of the through holes 23 or a too much bigger aperture of the through holes 23 may result in adverse effect on physical properties, such as mechanical strength, of the stretchable supporting film 21. Therefore, in preferred embodiments, the through holes 23 are periodically formed at positions which correspond in position to at least two adjacent light-emitting elements 22.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A method for expanding spacings in a light-emitting element array, comprising:
   providing a light-emitting element array unit including a stretchable supporting film, and a plurality of light-emitting elements disposed on the stretchable supporting film and arranged into a two-dimensional array, wherein the stretchable supporting film is formed with a plurality of through holes only located between adjacent two light-emitting elements;
   stretching the stretchable supporting film along a first direction and a second direction so as to expand spacings between the light-emitting elements, wherein the first direction and the second direction respectively correspond to a row direction and a column direction of the two-dimensional array;
   attaching a surface of each of the light-emitting elements onto a package substrate; and
   removing the stretchable supporting film therefrom, wherein the surface of each of the light-emitting elements is away from the stretchable supporting film.

2. The method of claim 1, wherein the step of stretching the stretchable supporting film is conducted by stretching the stretchable supporting film along the first direction followed by stretching the stretchable supporting film along the second direction.

3. The method of claim 1, wherein the step of stretching the stretchable supporting film is conducted by simultaneously stretching the stretchable supporting film along the first and second directions.

4. The method of claim 1, wherein the stretchable supporting film is formed with a plurality of through holes corresponding in position to the light-emitting elements.

5. The method of claim 4, wherein each of the light-emitting elements is configured into a geometric shape and has at least three corners, the through holes corresponding in position to the corners of the light-emitting elements.

6. The method of claim 4, wherein each of the light-emitting elements is configured into a geometric shape and has at least three sides each having a midpoint, the through holes corresponding in position to the midpoints of the sides of the light-emitting elements.

7. The method of claim 4, wherein the stretchable supporting film has a plurality of first imaginary lines each located equidistantly between two adjacent rows of the light-emitting elements, and a plurality of second imaginary lines each located equidistantly between two adjacent columns of the light-emitting elements, the through holes being formed on the first and second imaginary lines of the stretchable supporting film.

8. The method of claim 7, wherein the through holes of the stretchable supporting film are formed at intersections of the first and the second imaginary lines.

9. The method of claim 1, wherein the removal of the stretchable supporting film from the light-emitting elements is conducted by irradiating the stretchable supporting film with a light having a predetermined wavelength, so as to reduce adhesion strength between the stretchable supporting film and the light-emitting elements.

10. The method of claim 1, wherein the removal of the stretchable supporting film from the light-emitting elements is conducted by heating the stretchable supporting film so as to reduce adhesion strength between the stretchable supporting film and the light-emitting elements.

11. The method of claim 1, wherein the package substrate is one of a printed circuit board, a TFT substrate, and a CMOS substrate.

12. The method of claim 1, wherein the through holes are distributed in the spacings.

13. The method of claim 1, wherein the through holes are equidistant from adjacent two of the light-emitting elements when stretching the stretchable supporting film.

* * * * *